United States Patent
Takei et al.

(10) Patent No.: US 8,007,979 B2
(45) Date of Patent: *Aug. 30, 2011

(54) ACRYLIC POLYMER-CONTAINING GAP FILL MATERIAL FORMING COMPOSITION FOR LITHOGRAPHY

(75) Inventors: Satoshi Takei, Toyama (JP); Kazuhisa Ishii, Chiyoda-ku (JP); Takahiro Kishioka, Toyama (JP); Yasushi Sakaida, Toyama (JP)

(73) Assignee: Nissan Chemical Industries, Ltd., Tokyo (JP)

( * ) Notice: Subject to any disclaimer, the term of this patent is extended or adjusted under 35 U.S.C. 154(b) by 418 days.

This patent is subject to a terminal disclaimer.

(21) Appl. No.: 10/544,129

(22) PCT Filed: Feb. 20, 2004

(86) PCT No.: PCT/JP2004/001981
§ 371 (c)(1),
(2), (4) Date: Aug. 2, 2005

(87) PCT Pub. No.: WO2004/074938
PCT Pub. Date: Sep. 2, 2004

(65) Prior Publication Data
US 2006/0068526 A1  Mar. 30, 2006

(30) Foreign Application Priority Data
Feb. 21, 2003  (JP) .................................. 2003-044045

(51) Int. Cl.
*G03F 7/004* (2006.01)
*G03F 7/032* (2006.01)
*G03F 7/033* (2006.01)
*G03F 7/26* (2006.01)

(52) U.S. Cl. ..................... 430/270.1; 430/312; 430/908; 430/927

(58) Field of Classification Search ............... 430/270.1, 430/271.1, 276.1, 311, 312, 908, 927
See application file for complete search history.

(56) References Cited

U.S. PATENT DOCUMENTS

| 4,610,952 | A | * | 9/1986 | Crivello ........................ 430/325 |
| 5,693,691 | A | | 12/1997 | Flaim et al. |
| 5,919,599 | A | | 7/1999 | Meador et al. |
| 6,057,239 | A | | 5/2000 | Wang et al. |
| 2002/0110665 | A1 | | 8/2002 | Rutter, Jr. et al. |
| 2006/0041078 | A1 | * | 2/2006 | Takei et al. ................. 525/329.7 |

FOREIGN PATENT DOCUMENTS

| DE | 42 36 673 A1 | 5/1994 |
| GB | 939212 | 10/1963 |
| GB | 1 496 345 A | 12/1977 |
| JP | 2000-294504 A | 10/2000 |
| JP | 2002-047430 A | 2/2002 |
| JP | 2002-190519 A | 7/2002 |
| WO | WO 02/05035 | 1/2002 |

OTHER PUBLICATIONS

Tom Lynch et al., "Properties and Performance of Near UV Reflectivity Control Layers," US, in Advances in Resist Technology and Processing XI, Omkaram Nalamasu ed., Proceedings of SPIE, 1994, vol. 2195, p. 225-229.
G. Taylor et al., "Methacrylate Resist and Antireflective Coatings for 193 nm Lithography," US, in Microlithography 1999: in Advances in Resist Technology and Processing XVI, Will Conley ed., Proceedings of SPIE, 1999, vol. 3678, p. 174-185.
Jim D. Meador et al., "Recent Progress in 193 nm Antireflective Coatings," US, in Microlithography 1999; in Advances in Resist Technology and Processing XVI, Will Conley ed., Proceedings of SPIE, 1999, vol. 3678, p. 100-109.

* cited by examiner

*Primary Examiner* — Cynthia Kelly
*Assistant Examiner* — Anca Eoff
(74) *Attorney, Agent, or Firm* — Oliff & Berridge, PLC

(57) ABSTRACT

There is provided a gap fill material forming composition for lithography that is used in dual damascene process and is excellent in flattening property and fill property. Concretely, it is a gap fill material forming composition characterized in that the composition is used in manufacture of semiconductor device by a method comprising coating a photoresist on a semiconductor substrate having a hole with aspect ratio shown in height/diameter of 1 or more, and transferring an image to the semiconductor substrate by use of lithography process, and that comprises a polymer, a crosslinking agent and a solvent.

6 Claims, 1 Drawing Sheet

ACRYLIC POLYMER-CONTAINING GAP FILL MATERIAL FORMING COMPOSITION FOR LITHOGRAPHY

TECHNICAL FIELD

The present invention relates to a novel gap fill material forming composition for lithography, more specifically to a gap fill material for lithography that is excellent in flattening property of semiconductor substrates having unevenness like holes or trenches, is excellent in filling property of holes with aspect ratio shown in height/diameter of 1 or more, causes no intermixing with a photoresist, and has a higher dry etching rate than a photoresist. Particularly, the present invention relates to a gap fill material forming composition for use in damascene process for introducing interconnect material copper (Cu) which has been used in recent years for reducing interconnection delay that becomes a problem with miniaturization in interconnect pattern of semiconductor devices.

BACKGROUND ART

Conventionally, in the manufacture of semiconductor devices, micro-processing by lithography using a photoresist has been carried out. The micro-processing is a processing method comprising forming a thin film of a photoresist on a silicon wafer, irradiating actinic rays such as ultraviolet rays through a mask pattern on which a pattern for a semiconductor device is depicted, developing it to obtain a photoresist pattern, and etching the semiconductor substrate using the photoresist pattern as a protective film, thereby forming fine unevenness corresponding to the pattern on the surface of the substrate. However, in recent progress in high integration of semiconductor devices, there has been a tendency that shorter wavelength actinic rays are being used, i.e., ArF excimer laser beam (193 nm) has been taking the place of KrF excimer laser beam (248 nm). Along with this change, influences of random reflection and standing wave off a substrate have become serious problems. Accordingly, it has been widely studied to provide an anti-reflective coating between the photoresist and the substrate (Bottom Anti-Reflective Coating, BARC).

As the anti-reflective coating, inorganic anti-reflective coatings made of titanium, titanium dioxide, titanium nitride, chromium oxide, carbon or α-silicon and organic anti-reflective coatings made of a light absorbing substance and a polymer compound are known. The former requires an installation such as a vacuum deposition apparatus, a CVD (chemical vapor deposition) apparatus or a sputtering apparatus. In contrast, the latter is considered advantageous in that it requires no special installation so that many studies have been made. For example, mention may be made of the acrylic resin type anti-reflective coating having a hydroxyl group being a crosslinking reaction group and a light absorbing group in the same molecule and the novolak resin type anti-reflective coating having a hydroxyl group being a crosslinking reaction group and a light absorbing group in the same molecule (see, for example U.S. Pat. Nos. 5,919,599 and 5,693,691).

The physical properties desired for organic anti-reflective coating materials include high absorbance to light and radioactive rays, no intermixing with the photoresist layer (being insoluble in photoresist solvents), no diffusion of low molecular substances from the anti-reflective coating material into the topcoat photoresist upon coating or heat-drying, and a higher dry etching rate than the photoresist (see, for example, Tom Lynch et al., "Properties and Performance of Near UV Reflectivity Control Layers", US, in Advances in Resist Technology and Processing XI, Omkaram Nalamasu ed., Proceedings of SPIE, 1994, Vol. 2195, p. 225-229; G. Taylor et al., "Methacrylate Resist and Antireflective Coatings for 193 nm Lithography", US, in Microlithography 1999: in Advances in Resist Technology and Processing XVI, Will Conley ed., Proceedings of SPIE, 1999, Vol. 3678, p. 174-185; and Jim D. Meador et al., "Recent Progress in 193 nm Antireflective Coatings, US, in Microlithography 1999: in Advances in Resist Technology and Processing XVI, Will Conley ed., Proceedings of SPIE, 1999, Vol. 3678, p. 800-809).

On the other hand, in order to solve interconnection delay that has become clear with miniaturization in pattern rule of semiconductor devices in recent years, it has been considered to use copper as interconnect material, and to apply Dual Damascene process as interconnect forming method on the semiconductor device (see, for example U.S. Pat. No. 6,057,239). And, in Dual Damascene process, via holes are formed and an anti-reflective coating is formed on a substrate having a high aspect ratio. Therefore, the anti-reflective coating for use in this process is required to have control of coating performance of anti-reflective coating on a substrate of the periphery of hole, filling property by which via holes can be filled without gap, flattening property by which a flat coating can be formed on the surface of substrate, and the like in addition to the above-mentioned properties.

However, it is difficult to apply organic material for anti-reflective coating on a substrate having a high aspect ratio, and in recent years, material with particular emphasis on filling property or flattening property, that is, gap fill material has been developed (see, for example JP 2000-294504 A, WO 02/05035, JP 2002-190519 A, and JP 200247430 A).

And, it comes to be discussed a process in which two layers of an inorganic or organic anti-reflective coating having a high absorbance for light or radiation and a gap fill material for lithography for flattening are used. In the process, a gap fill material is applied on a substrate having a high aspect ratio, holes thereon are filled and the surface of the substrate is flattened. And, on the gap fill material, an organic anti-reflective coating or photoresist is formed.

The gap fill material for lithography mentioned above is Gap-Filling material, that is, a filler or a flattening agent. The advantages of the process reside in that because unevenness on a substrate is flattened by the gap fill material, a photoresist formed thereon comes to have an even film thickness and consequently a high resolution is obtained in lithography process.

In addition, the gap fill material has a high dry etching rate as it contains no compound having light absorption characteristics that is contained in an anti-reflective coating. Thus, the gap fill material shows a high etching selection ratio with the photoresist in etching process, and decrease in film thickness due to the etching of photoresist can be inhibited, and adverse effects on the underlaid substrate in the etching process can be inhibited.

Characteristic properties required for gap fill material for lithography are as follows: a gap fill material is insoluble in a solvent used for a photoresist (no intermixing with a photoresist causes); there is no low molecular matter diffused from a gap fill material layer to an overlaid photoresist or anti-reflective coating upon coating or heat-drying; it has a higher dry etching rate than a photoresist; and the surface of a substrate with a high aspect ratio (unevenness) can be flattened. And, any gap fill material for lithography satisfying all of these requirements is desired.

Taking the above-mentioned present status into account, the present inventors have eagerly studied, and as a result of it, found that a composition in which an acrylic polymer or a methacrylic polymer containing low molecular weight components in a low content is contained as a constituent component is suitable for a material for forming a gap fill material, and they completed the present invention.

The present invention relates to a gap fill material forming composition that is used in manufacture of semiconductor device by a method comprising coating a photoresist on a semiconductor substrate having a hole with a high aspect ratio that is used for example in dual damascene process, and transferring an image to the semiconductor substrate by use of lithography process.

An object of the present invention is to provide a gap fill material forming composition that can be used in such a lithography process in manufacture of semiconductor device. In addition, another object of the present invention is to provide a gap fill material that causes no intermixing with a photoresist layer, has a high dry etching rate compared with the photoresist, causes no diffusion of low molecular substances into the overlaid photoresist or anti-reflective coating upon coating or heat-drying, can accomplish a high flattening property to a substrate having a high aspect ratio (unevenness), and has an excellent filling property to holes; and a gap fill material forming composition for forming the above-mentioned gap fill material. Also, further object of the present invention is to provide a method for forming a gap fill material for lithography by use of a gap fill material forming composition, and a method for forming a photoresist pattern.

DISCLOSURE OF INVENTION

The present invention relates to the following aspects:

as a first aspect, a gap fill material forming composition characterized in that the composition is used in manufacture of semiconductor device by a method comprising coating a photoresist on a semiconductor substrate having a hole with aspect ratio shown in height/diameter of 1 or more, and transferring an image to the semiconductor substrate by use of lithography process, and that the composition comprises a polymer composed of only structural unit of formula (1)

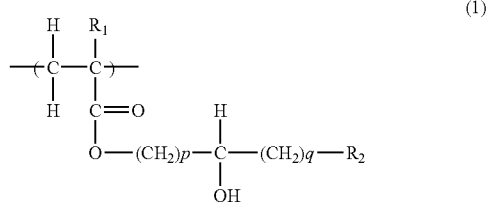

wherein $R_1$ is hydrogen atom, methyl group, chlorine atom or bromine atom, $R_2$ is hydrogen atom or hydroxy group, p is the number of 1, 2, 3 or 4, q is the number of 0, 1, 2 or 3, and containing components having a molecular weight of 3000 or less in a rate of 20% or less; a crosslinking agent; and a solvent;

as a second aspect, a gap fill material forming composition characterized in that the composition is used in manufacture of semiconductor device by a method comprising coating a photoresist on a semiconductor substrate having a hole with aspect ratio shown in height/diameter of 1 or more, and transferring an image to the semiconductor substrate by use of lithography process, and that the composition comprises a polymer composed of only structural unit of formula (1) and structural unit of formula (2)

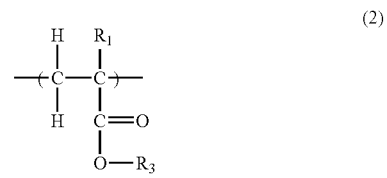

wherein $R_1$ is as defined above, $R_3$ is $C_{1-8}$ alkyl group, benzyl group, $C_{1-6}$ alkyl group substituted by at least one fluorine atom, chlorine atom or bromine atom, or $C_{1-6}$ alkyl group substituted by at least one $C_{1-6}$ alkoxy group, and containing components having a molecular weight of 3000 or less in a rate of 20% or less, and containing the structural unit of formula (1) in a ratio of 0.10 to 0.95; a crosslinking agent; and a solvent, wherein the sum of the molar ratio of structural unit of formula (1) and the molar ratio of structural unit of formula (2) is 1;

as a third aspect, the gap fill material forming composition as described in the first or second aspect, wherein the polymer has a weight average molecular weight of 5000 to 20000;

as a fourth aspect, the gap fill material forming composition as described in the first or second aspect, wherein the solvent has a boiling point of 145° C. to 220° C.;

as a fifth aspect, the gap fill material forming composition as described in the first or second aspect, wherein the solvent is at least one solvent selected from the group consisting of butyl lactate, propylene glycol monobutyl ether, propylene glycol monomethyl ether, propylene glycol monomethyl ether acetate and cyclohexanone;

as a sixth aspect, the gap fill material forming composition as described in the first or second aspect, wherein the crosslinking agent is a crosslinking agent having at least two crosslink-forming functional substituents;

as a seventh aspect, the gap fill material forming composition as described in any one of the first to sixth aspects, further containing an acid or an acid generator;

as an eighth aspect, a method for forming a gap fill material for use in lithography process of manufacture of semiconductor device, comprising coating the gap fill material forming composition as described in any one of the first to seventh aspects on a semiconductor substrate having a hole with aspect ratio shown in height/diameter of 1 or more and baking it;

as a ninth aspect, a method for forming photoresist pattern for use in manufacture of semiconductor device, comprising coating the gap fill material forming composition as described in any one of the first to seventh aspects on a semiconductor substrate having a hole with aspect ratio shown in height/diameter of 1 or more, baking it to form a gap fill material, forming a photoresist layer on the gap fill material, exposing the semiconductor substrate covered with the gap fill material and the photoresist layer to light, and developing the photoresist layer after the exposure to light; and as a tenth aspect, the method for forming photoresist pattern as described in the ninth aspect, further comprising a step of forming an anti-reflective coating before or after the step of forming the gap fill material on the semiconductor substrate.

BEST MODE FOR CARRYING OUT THE INVENTION

Figure 1:
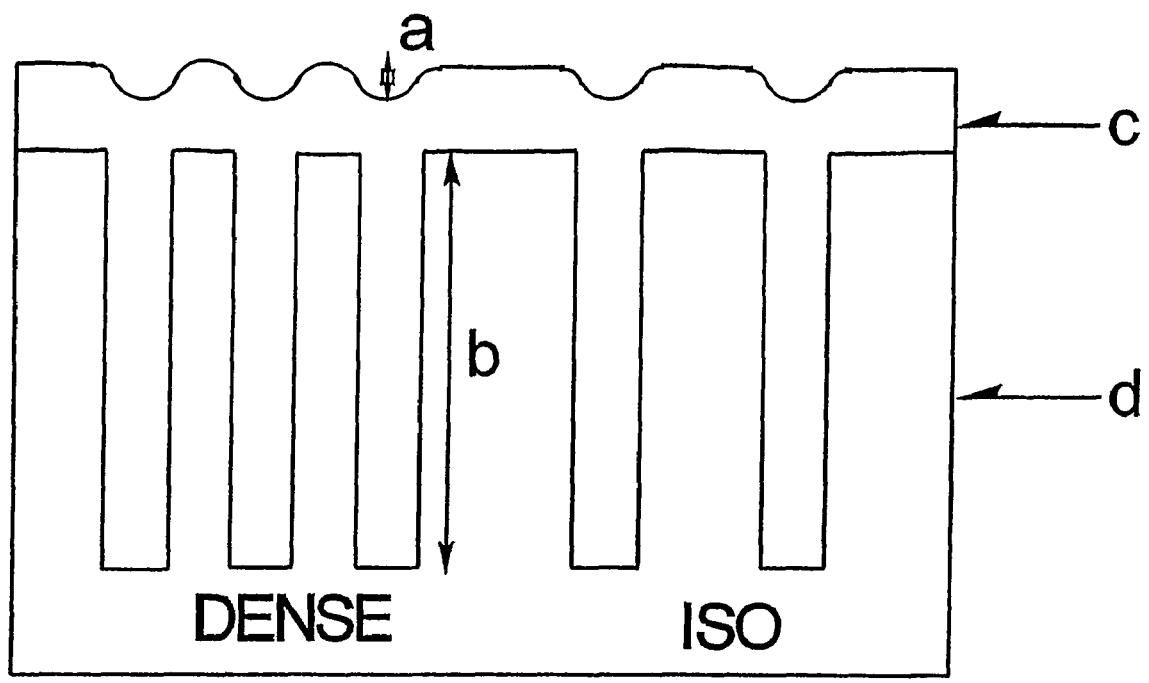
FIG. 1 is a sectional view of a state where a gap fill material is formed on a substrate having holes, in which symbol a is dimple depth of the gap fill material at the center of the hole, b is hole depth in the substrate, c is the gap fill material, and d is the substrate.

The present invention relates to a gap fill material forming composition used in a manufacture of a semiconductor device by a method comprising coating a photoresist on a semiconductor substrate having a hole with aspect ratio shown in height/diameter of 1 or more, and transferring an image to the semiconductor substrate by use of lithography process, and comprising a polymer, a crosslinking agent and a solvent. In addition, it relates to a method for forming a gap fill material for lithography by use of the gap fill material forming composition, and a method for forming photoresist pattern.

The gap fill material forming composition of the present invention basically comprises a polymer, a crosslinking agent, and a solvent, and as arbitrary components an acid, an acid generator, a surfactant or the like. The solid content in the gap fill material forming composition of the present invention is for example 0.1 to 50 mass %, or for example 0.5 to 30 mass %. In this specification, the solid content means the polymer, the crosslinking agent, the arbitrary components and the like, in other words, all components in the gap fill material forming composition from which the solvent component is excluded.

In the solid content of the gap fill material forming composition according to the present invention, the polymer and the crosslinking agent are essential components, and their blending proportion is the polymer in an amount of 50 to 99 mass % or 60 to 95 mass %, and the crosslinking agent in an amount of 1 to 50 mass % or 5 to 40 mass %.

The molecular weight of the polymer used in the gap fill material forming composition according to the present invention is in the term of weight average molecular weight, for example 5000 to 50000 or 5000 to 20000, or for example 9000 to 15000 or 9000 to 12000.

In order to form the layer of the gap fill material form the gap fill material forming composition according to the present invention, baking is carried out. In this process, components having low molecular weight abundantly contained in the composition cause a problem that an apparatus is polluted by sublimation of the components having low molecular weight, or the like. Therefore, it is preferable that the components having low molecular weight are contained in a small amount in the gap fill material forming composition according to the present invention. It is preferable to use a polymer containing components having a molecular weight of 3000 or less in a ratio of 20% or less, or in a ratio of 10% or less, as the polymer used in the gap fill material forming composition according to the present invention.

In addition, in case where the polymer has a large weight average molecular weight, the gap fill material forming composition may have a low filling property into the inside of holes, or may not give sufficient flattening property to the substrate.

In the gap fill material forming composition according to the present invention, the polymer composed of only structural unit of formula (1) is used. In formula (1), $R_1$ is hydrogen atom, methyl group, chlorine atom or bromine atom, $R_2$ is hydrogen atom or hydroxy group, p is the number of 1, 2, 3 or 4, q is the number of 0, 1, 2 or 3.

The polymer can be produced by polymerization of monomers having addition polymerization unsaturated bond of formula (3).

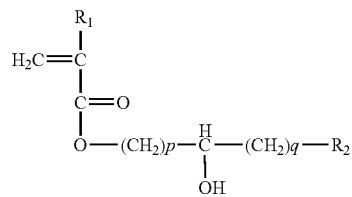

The polymer can be produced by dissolving the monomer of formula (3) (concentration: 10-60%) and a chain transfer agent (1-10% based on the mass of the monomer) to be optionally added, in an organic solvent, and then adding a polymerization initiator to subject to polymerization reaction, and adding a short-stop. The amount of the polymerization initiator to be added is 1 to 10% based on the mass of the monomer, and the amount of the short-stop to be added is 0.01 to 0.2%.

The organic solvent used in the reaction includes propylene glycol monomethyl ether, propylene glycol monopropyl ether, ethyl lactate and dimethyl formamide, etc., and the chain transfer agent includes dodecane thiol and dodecyl thiol, etc., the polymerization initiator includes azobisisobutyronitrile and azobiscyclohexane carbonitrile, etc., and the short-stop includes 4-methoxyphenol, etc. The reaction temperature is appropriately selected from 60 to 90° C., and the reaction time is appropriately selected from 6 to 24 hours.

Concrete examples of the monomer of formula (3) include for example 2-hydroxyethylacrylate, 2-hydroxyethylmethacrylate, 2-hydroxypropylacrylate, 2-hydroxypropylmethacrylate, 2,3-dihydroxypropylacrylate, 4-hydroxybutylacrylate, 4-hydroxybutylmethacrylate, and the like.

As the polymer in the gap fill material forming composition according to the present invention, the polymer produced from one kind of monomer of formula (3) can be used, or the polymer produced from two or more kinds of monomers of formula (3) can be also used. Concrete examples of the polymer include for example poly(2-hydroxyethyl)acrylate, poly(2-hydroxyethyl)methacrylate, poly(2-hydroxypropyl)acrylate, poly(2-hydroxypropyl)methacrylate, a copolymer of 2-hydroxyethylacrylate with 2-hydroxyethyl methacrylate, a copolymer of 2-hydroxyethylacrylate with 2-hydroxypropylmethacrylate, a copolymer of 2-hydroxypropylacrylate with 2-hydoxyethylmethacrylate, a copolymer of 2-hydroxyethylacrylate, 2-hydroxyethylmethacrylate and 2-hydroxypropylacrylate, and the like.

In the gap fill material forming composition of the present invention, the polymer composed of only the structural unit of formula (1) and the structural unit of formula (2) is also used. In formula (2), $R_3$ is $C_{1-8}$ alkyl group, benzyl group, $C_{1-6}$ alkyl group substituted by at least one fluorine atom, chlorine atom or bromine atom, or $C_{1-6}$ alkyl group substituted by at least one $C_{1-6}$ alkoxy group.

In the polymer composed of the structural units of formulae (1) and (2), the ratio of the structural unit (molar ratio of the structural unit) of formula (1) is 0.10 or more, for example 0.10 to 0.95, or for example 0.20 to 0.90, 0.30 to 0.80, or for example 0.40 to 0.70. As the hydroxy group in formula (1) is a crosslink forming substituent, it can be subjected to crosslinking reaction with the crosslinking agent. It is preferable that the polymer can be subjected to crosslinking reaction with the crosslinking agent, and therefore it is preferable that the structural unit of formula (1) is contained in a ratio of at least 0.10 in the polymer. In the meanwhile, the sum of the molar ratio of structural unit of formula (1) and the molar ratio of structural unit of formula (2) is 1.

The polymer can be produced by polymerization of monomers having addition polymerization unsaturated bond of formulae (3) and (4).

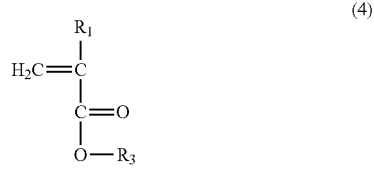

The polymer can be produced by dissolving the monomers of formulae (3) and (4) (concentration: 10-60%) and a chain transfer agent (1-10% based on the mass of the monomer) to be optionally added, in an organic solvent, and then adding a polymerization initiator to subject to polymerization reaction, and adding a short-stop. The amount of the polymerization initiator to be added is 1 to 10% based on the mass of the monomer, and the amount of the short-stop to be added is 0.01 to 0.2%.

The organic solvent used in the reaction includes propylene glycol monomethyl ether, propylene glycol monopropyl ether, ethyl lactate and dimethyl formamide, etc., and the chain transfer agent includes dodecane thiol and dodecyl thiol, etc., the polymerization initiator includes azobisisobutyronitrile and azobiscyclohexane carbonitrile, etc., and the short-stop includes 4-methoxyphenol, etc. The reaction temperature is appropriately selected from 60 to 90° C., and the reaction time is appropriately selected from 6 to 24 hours.

In formula (4), $R_3$ is $C_{1-8}$ alkyl group, benzyl group, $C_{1-6}$ alkyl group substituted by at least one fluorine atom, chlorine atom or bromine atom, or $C_{1-6}$ alkyl group substituted by at least one $C_{1-6}$ alkoxy group. Concrete examples of $R_3$ are for example straight-chain alkyl groups such as methyl group, ethyl group, n-propyl group or n-hexyl group, branched alkyl groups such as isopropyl group, isobutyl group or 2-ethylhexyl group, alicyclic alkyl groups such as cyclopentyl group or cyclohexyl group, alkyl groups substituted by halogen atom, such as trichloroethyl group or trifluoroethyl group, alkoxyalkyl groups such as methoxyethyl group or ethoxyethyl group, and benzyl group.

Concrete examples of the monomer of formula (4) include for example methylacrylate, methylmethacrylate, ethylmethacrylate, isopropylacrylate, isobutylmethacrylate, n-pentylmethacrylate, cyclohexylmethacrylate, n-octylacrylate, 2-ethylhexylmethacrylate, cyclohexylmethylmethacrylate, benzylacrylate, benzylmethacrylate, 2-chloroethylacrylate, 2-fluoroethylmethacrylate, 2-bromoethylmethacrylate, 2,2,2-trifluoroethylacrylate, 2,2,2-trifluoroethylmethacryalte, 2,2,2-tribromoethylacryalte, 2,2,2-tribromoethylmethacryalte, 2,2,2-trichloroethylmethacrylate, 2,2,3,3,4,4,4-heptafluorobutylmethacrylate, hexafluoroisopropylmethacrylate, 2-methoxyethylacrylate, 2-methoxyethylmethacrylate, 2-ethoxyethylacrylate, 2-ethoxyethylmethacrylate, 2-n-butoxyethylmethacryalte, 3-methoxybutylmethacrylate, and the like.

As the polymer in the gap fill material forming composition according to the present invention, the following polymers can be used: the polymer produced from one kind of monomer of formula (3) and one kind of monomer of formula (4), and the polymer produced from two or more kinds of monomers (3) and two or more kinds of monomers (4). Concrete examples of the polymer include for a copolymer of 2-hydroxyethylacrylate with methylacrylate, a copolymer of 2-hydroxyethylacrylate with ethylacrylate, a copolymer of 2-hydroxyethylacrylate with isopropylacrylate, a copolymer of 2-hydroxyethylacrylate with n-butylacrylate, a copolymer of 2-hydroxyethylmethacrylate with methylacrylate, a copolymer of 2-hydroxyethylmethacrylate with ethylacrylate, a copolymer of 2-hydroxyethylmethacrylate with n-propylacrylate, a copolymer of 2-hydroxyethylmethacrylate with isobutylacrylate, a copolymer of 2-hydroxyethylacrylate with methylmethacrylate, a copolymer of 2-hydroxyethylacrylate with ethylmethacrylate, a copolymer of 2-hydroxyethylacrylate with isopropylmethacrylate, a copolymer of 2-hydroxyethylacrylate with isobutylmethacrylate, a copolymer of 2-hydroxyethylmethacrylate with methylmethacrylate, a copolymer of 2-hydroxyethylmethacrylate with ethylmethacrylate, a copolymer of 2-hydroxyethylmethacrylate with n-propylmethacrylate, a copolymer of 2-hydroxyethylmethacrylate with n-butylmethacrylate, a copolymer of 2-hydroxypropylacrylate with methylacrylate, a copolymer of 2-hydroxypropylacrylate with ethylacrylate, a copolymer of 2-hydroxypropylacrylate with n-propylacrylate, a copolymer of 2-hydroxypropylacrylate with n-butylacrylate, a copolymer of 2-hydroxybutylacrylate with methylacrylate, a copolymer of 2-hydroxybutylacrylate with ethylacrylate, a copolymer of 2-hydroxybutylacrylate with n-propylacrylate, a copolymer of 2-hydroxybutylacrylate with n-butylacrylate, a copolymer of 2-hydroxypropylacrylate with 2,2,2-trifluoroethylmethacrylate, a copolymer of 2-hydroxyethylmethacrylate with 2,2,2-trifluoroethylmethacrylate, a copolymer of 2-hydroxyethylmethacrylate with 2,2,2-trichloroethylmethacrylate, a copolymer of 2-hydroxyethylacrylate with 2-fluoroethylmethacrylate, a copolymer of 2-hydroxyethylmethacrylate with 2-chloroethylmethacrylate, a copolymer of 2-hydroxyethylmethacrylate with 2,2,3,3,4,4,4-heptafluorobutylmethacrylate, a copolymer of 2-hydroxyethylacrylate with 2,2,2-tribromoethylmethacryalte, a copolymer of 2-hydroxyethylmethacrylate with 2-ethoxyethylmethacrylate, a copolymer of 2-hydroxyethylacrylate with benzylmethacrylate, a copolymer of 2-hydroxyethylacrylate, 2-hydroxyethylmethacrylate and methylacrylate, a copolymer of 2-hydroxypropylacrylate, 2-hydroxyethylmethacrylate and methylacrylate, a copolymer of 2-hydroxyethylacrylate, 2-hydroxyethylmethacrylate and methylmethacrylate, a copolymer of 2-hydroxyethylacrylate, ethylmethacrylate and 2,2,2-trifluoroethylmethacrylate, a copolymer of 2-hydroxyethylmethacrylate, 2-ethoxyethylmethacrylate and n-hexylmethacrylate, a copolymer of 2-hydroxyethylmethacrylate, 2-hydroxyethylacrylate, ethylmethacrylate and 2,2,2-trifluoroethylmehtacrylate, and the like.

The gap fill material forming composition of the present invention contains the crosslinking agent. Therefore, when baking is carried out in order to form a gap fill material after applying the gap fill material forming composition on a substrate, crosslinking reaction occurs. And, the resulting gap fill material becomes tight due to the crosslinking reaction, and shows a low solubility in organic solvents generally used for photoresists or anti-reflective coating forming compositions, for example ethylene glycol monomethyl ether, ethyl cellosolve acetate, diethylene glycol monoethyl ether, propylene glycol, propylene glycol monomethyl ether, propylene glycol monomethyl ether acetate, propylene glycol propyl ether acetate, toluene, methyl ethyl ketone, cyclohexanone, ethyl 2-hydroxypropionate, ethyl 2-hydroxy-2-methylpropionate, ethyl ethoxyacetate, methyl pyruvate, ethyl lactate, butyl lactate, etc. Thus, the gap fill material formed from the gap fill material forming composition according to the present invention causes no intermixing with photoresists or anti-reflective coatings formed on the gap fill material.

The crosslinking agent is not specifically limited, and the crosslinking agent having at least two crosslink forming substitutes is preferably used. For example, melamine compounds or substituted urea compounds having a crosslink forming substituent such as methylol group or methoxymethyl group may be mentioned. Compounds that may be concretely mentioned are methoxymethylated glycoluril or methoxymethylated melamine, etc., for example tetramethoxymethyl glycoluril, tetrabutoxymethyl glycoluril or hexamethoxymethyl melamine. In addition, tetramethoxy methylurea, tetrabutoxy methylurea and the like may be mentioned. Although these crosslinking agents occasionally cause crosslinking reaction due to self-condensation, it can cause crosslinking reaction with the crosslink forming substituent contained in the polymer, or the hydroxy group in the formula (1).

To the gap fill material forming composition according to the present invention, as catalyst for promoting the above-mentioned crosslinking reaction, acid compounds, such as p-toluenesulfonic acid, trifluoromethanesulfonic acid, pyridinium p-toluenesulfonate, salicylic acid, sulfosalicylic acid, citric acid, benzoic acid, hydroxybenzoic acid, etc., or acid generators such as 2,4,4,6-tetrabromocyclohexadienone, benzointosylate, 2-nitrobenzyltosylate, bis(4-t-butylphenyl) iodonium trifluoromethanesulfonate, triphenylsulfonium trifluoromethanesulfonate, phenyl-bis(trichloromethyl)-s-triazine, benzointosylate, N-hydroxysuccinimide trifluoromethanensulfonate, etc. can be added. The added amount of these acids or acid generators is 5 mass % or less, for example 0.01 to 5 mass %, or for example 0.04 to 5 mass % in the total solid contents although it is altered depending on the kind or amount of the polymer or the crosslinking agent added.

The gap fill material forming composition according to the present invention may contain further rheology controlling agents, adhesion auxiliaries, surfactants, etc. in addition to the above described ones, if necessary.

The rheology controlling agents are added mainly aiming at increasing the flowability of the gap fill material forming composition and in particular in the baking step, increasing fill property of the gap fill material forming composition into the inside of holes. Specific examples thereof include phthalic acid derivatives such as dimethyl phthalate, diethyl phthalate, diisobutyl phthalate, dihexyl phthalate or butyl isodecyl phthalate; adipic acid derivatives such as di-n-butyl adipate, diisobutyl adipate, diisooctyl adipate or octyidecyl adipate; maleic acid derivatives such as di-n-butyl maleate, diethyl maleate or dinonyl maleate; oleic acid derivatives such as methyl oleate, butyl oleate or tetrahydrofurfuryl oleate; or stearic acid derivatives such as n-butyl stearate or glyceryl stearate. The rheology controlling agents are blended in proportions of usually less than 30 mass % in the gap fill material forming composition.

The adhesion auxiliaries are added mainly for the purpose of increasing the adhesion between a substrate, or an anti-reflective coating or a photoresist and a gap fill material formed from a gap fill material forming composition, in particular preventing the detachment in development. Specific examples thereof include chlorosilanes such as trimethylchlorosilane, dimethylvinylchlorosilane or chloromethyldimethyl chlorosilane; alkoxysilanes such as trimethylmethoxysilane, dimethyldiethoxysilane, dimethylvinylethoxysilane, γ-methacryloxypropyltrimethoxysilane, diphenyldimethoxysilane or phenyltriethoxysilane; silazanes such as hexamethyldisilazane, N,N'-bis(trimethylsilyl)urea, dimethyltrimethylsilylamine or trimethylsilylimidazole; silanes such as γ-chloropropyltrimethoxysilane, γ-aminopropyltriethoxysilane, γ-glycidoxypropyltrimethoxysilane or γ-methacryloxypropyltrimethoxysilane; heterocyclic compounds such as benzotriazole, benzimidazole, indazole, imidazole, 2-mercaptobenzimidazole, 2-mercaptobenzothiazole, 2-mercaptobenzoxazole, urazole, thiouracyl, mercaptoimidazole or mercaptopyrimidine; ureas such as 1,1-dimethylurea or 1,3-dimethylurea, or thiourea compounds. The adhesion auxiliaries are added in proportions of usually less than 10 mass %, preferably less than 5 mass %, in the gap fill material forming composition.

The gap fill material forming composition according to the present invention may contain surfactants with view to preventing the occurrence of pinholes or striations and further increasing coatability not to cause surface unevenness. As the surfactants, mention may be made of, for example, nonionic surfactants such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkyl allyl ethers, e.g., polyoxyethylene octyl phenol ether, polyoxyethylene nonyl phenol ether, etc.; polyoxyethylene/polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., polyoxyethylene sorbitan fatty acid esters, e.g., polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc.; fluorine based surfactants, e.g., trade name: EFTOP EF301, EF303, EF352 (manufactured by Tochem Products Co., Ltd.), trade name: MEGAFAC F171, F173, R-08, R-30 (manufactured by Dainippon Ink and Chemicals, Inc.), trade name: FLUORAD FC430, FC431 (manufactured by Sumitomo 3M Limited), trade name: ASAHI GUARD AG710, SURFLON S-382, SC101, SC102, SC103, SC104, SC105, SC106 (manufactured by Asahi Glass Co., Ltd.); organosiloxane polymer KP341 (manufactured by Shinetsu Chemical Co., Ltd.), etc. The blending amount of the surfactants is usually 0.2 mass % or less, preferably 0.1 mass % or less, in the gap fill material forming composition according to the present invention. The surfactants may be added singly or two or more of them may be added in combination.

In the gap fill material forming composition of the present invention, several solvents for dissolving the above-mentioned polymer and crosslinking agent, and the like can be used. As the solvents, use may be made of ethylene glycol monomethyl ether, ethylene glycol monoethyl ether, methyl cellosolve acetate, ethyl cellosolve acetate, diethylene glycol monomethyl ether, diethylene glycol monoethyl ether, propylene glycol, propylene glycol monomethyl ether, propylene glycol monomethyl ether acetate, propylene glycol propyl ether acetate, toluene, xylene, methyl ethyl ketone, cyclopentanone, cyclohexanone, ethyl 2-hydroxypropionate, ethyl 2-hydroxy-2-methylpropionate, ethyl ethoxyacetate, ethyl hydroxyacetate, methyl 2-hydroxy-3-methylbutanoate, methyl 3-methoxypropionate, ethyl 3-methoxypropionate, ethyl 3-ethoxypropionate, methyl 3-ethoxypropionate, methyl pyruvate, ethyl pyruvate, ethyl acetate, butyl acetate, ethyl lactate, butyl lactate, etc. These solvents may be used singly or in combination of two or more of them. Further, high boiling solvents such as propylene glycol monobutyl ether or propylene glycol monobutyl ether acetate, etc. may be mixed.

Among these solvents, it is preferable to use the solvents, the boiling point of which is higher than the glass transition temperature of the above-mentioned polymer. Particularly, preferable solvents are solvents, the boiling point of which is higher than the glass transition temperature of the polymer by 10° C. or more. In addition, taking the baking temperature in baking after applying the gap fill material forming composition of the present invention on the substrate into account, it is preferable that the boiling point of these solvents ranges from 145 to 220° C. The use of the solvents having relatively high boiling point brings about a maintenance of fluidity of the gap fill material forming composition in baking process for a predetermined time, and therefore filling property into the inside of holes and flattening property can be improved.

Preferable solvents are propylene glycol monomethyl ether, propylene glycol monobutyl ether, butyl lactate, diethylene glycol monomethyl ether, cyclohexanone, propylene glycol monomethylether acetate, and among them butyl lactate, propylene glycol monobutyl ether, propylene glycol monomethylether acetate, cycloheanone, diethylene glycol monomethyl ether or a mixture of them is particularly preferable.

The gap fill material forming material forming composition of the present invention is used in a manufacture process of semiconductor devices by using substrate having holes with an aspect ratio shown in height/diameter of 1 or more, particularly in a lithography process of dual damascene process.

In dual damascene process, interconnect trench (trench) and connection hole (via hole) are provided at the same part of a substrate, and copper is utilized as interconnect material for bedding. The substrate used in dual damascene process has holes with an aspect ratio shown in height/diameter of 1 or more, generally 1 to 20. Therefore, it is difficult to fill the holes having the above-mentioned aspect ratio to the narrow parts thereof with any conventional sub-layer material such as anti-reflective coating material or the like, and as the result of it, there was a problem that voids (gaps) are formed in the inside of the holes. In addition, when the conventional sub-layer material is applied on a substrate having holes with a spinner, and then baked, dimples of the sub-layer material are formed at the upper part of the holes, and this causes insufficient flattening property. Consequently, even when a photoresist is applied thereon, an excellent pattern is not obtained due to diffused reflection resulting from unevenness from the lower surface of the photoresist.

On the other hand, by using the gap fill material forming composition of the present invention, a high fill property and flattening property of the gap fill material formed therefrom can be accomplished.

Hereinafter, the utilization of the gap fill material forming composition of the present invention is described.

On a substrate having holes with an aspect ratio shown in height/diameter of 1 or more (for example, silicon/silicon dioxide coat substrate, silicon nitride substrate, glass substrate, ITO substrate or the like), the gap fill material forming composition of the present invention is coated by a suitable coating method, for example, with a spinner, a coater or the like, and thereafter the substrate is baked to fabricate a gap fill material layer (FIG. 1). The conditions of baking are suitably selected from baking temperature of 60 to 250° C. and baking time of 0.3 to 60 minutes. These procedures provide a gap fill material layer without occurrence of voids (gaps) inside the holes and with a high flattening property (FIG. 1). In FIG. 1, a is dimple depth (μm) of the gap fill material at the top of the hole, b is hole depth (μm), and flattening rate (%)=1−(a/b)×100.

Next, a photoresist is formed directly on the gap fill material or after forming an anti-reflective coating, and then a substrate processing is carried out by exposure to light, development and dry etching.

The gap fill material layer formed from the gap fill material forming composition according to the present invention is completely removed finally after exposure to light and development of photoresist, and substrate processing, and the like in a process of manufacture of semiconductor device. The removal is generally carried out by dry etching. In the removal by dry etching, it is generally known that the higher the proportion of aromatic ring structure contained in a layer to be removed is, the lower the removal rate is. Therefore, in case where it is desired to raise the removal rate by dry etching, it is preferable to reduce the amount of aromatic ring structure contained in the gap fill material forming composition used. Particularly, it is preferable to reduce the amount of aromatic ring structure contained in the polymer component. Therefore, when a gap fill material layer with a high removal rate by dry etching is required, a polymer having no aromatic ring structure in the structure thereof is preferably used.

As photoresist to be coated and formed as an upper layer of the gap fill material layer in the present invention, any of negative type and positive type photoresists may be used. The photoresist includes a positive type photoresist consisting of a novolak resin and 1,2-naphthoquinone diazide sulfonic acid ester, a chemically-amplified type photoresist which consists of a photoacid generator and a binder having a group which is decomposed with an acid and increases alkali dissolution rate, a chemically-amplified type photoresist consisting of an alkali-soluble binder, a photoacid generator, and a low molecular compound which is decomposed with an acid and increases the alkali dissolution rate of the photoresist, a chemically-amplified photoresist consisting of a photoacid generator, a binder having a group which is decomposed with an acid and increases the alkali dissolution rate, and a low molecular compound which is decomposed with an acid and increases the alkali dissolution rate of the photoresist. For example, trade name: APEX-E manufactured by Shipley Company, trade name: PAR710 manufactured by Sumitomo Chemical Co., Ltd., and trade name: SEPR430 manufactured by Shinetsu Chemical Co., Ltd., and the like can be mentioned. And, a photoresist is formed, thereafter it can be exposed to light through a predetermined mask, developed, rinsed and dried to obtain a photoresist pattern. If necessary, post exposure bake (PEB) may be performed.

As developers for positive type photoresists having the gap fill material formed by use of the gap fill material forming composition for lithography according to the present invention, the following aqueous solutions of alkalis can be used: inorganic alkali such as sodium hydroxide, potassium hydroxide, sodium carbonate, sodium silicate, sodium metasilicate or ammonia water, etc., primary amines such as ethylamine or n-propylamine, etc., secondary amines such as diethylamine or di-n-butylamine, etc., tertiary amines such as triethylamine or methyidiethylamine, etc., alcohol amines such as dimethylethanol amine or triethanol amine, etc., quaternary ammonium salt such as tetramethylammonium hydroxide, tetraethylammonium hydroxide or choline, etc., cyclic amine such as pyrrole or piperidine, etc. Furthermore, a suitable amount of alcohols such as isopropyl alcohol or surfactants such as anionic surfactant can be added to the above-mentioned aqueous solution of alkalis. Among them, preferable developers are quaternary ammonium salts, and more preferably tetramethylammonium hydroxide and choline.

On the gap fill material layer in the present invention, an anti-reflective coating layer may be applied and formed prior to application and forming of the photoresist. The anti-reflective coating composition used in such a case is not specifically limited, and can be arbitrarily selected from those conventionally used in the prior lithography process, and used. In addition, the anti-reflective coating can be formed by coating by the conventional method, for example, with a spinner or a coater, and baking. The anti-reflective coating composition includes for example one containing as main components a light absorbing compound, a polymer and a solvent, one containing as main components a polymer having a light absorbing group through chemical bond, a crosslinking agent and a solvent, one containing as main components a light absorbing compound, a crosslinking agent and a solvent, one containing as main components a polymer crosslinking agent having a light absorbing property and a solvent, and the like. The anti-reflective coating composition may contain an acid component, an acid generator component, a rheology controlling agent, or the like, if necessary. The light absorbing compounds that can be used are any compounds having a high absorption for light at photosensitive characteristic wavelength region of the photosensitive component in the photoresist provided on the anti-reflective coating, and include for example benzophenone compounds, benzotriazole compounds, azo compounds, naphthalene compounds, anthracene compounds, anthraquinone compounds, triazine compounds, and the like. The polymers include polyesters, polyimides, polystyrenes, phenol novolak, polyacetal, acrylic polymers, and the like. The polymers having a light absorbing group through chemical bond include polymers having a light absorbing aromatic ring structure such as anthracene ring, naphthalene ring, benzene ring, quinoline ring, quinoxaline ring or thiazole ring.

The substrates on which the gap fill material forming composition of the present invention is applied are substrates having holes with an aspect ratio shown in height/diameter of 1 or more (for example, silicon/silicon dioxide coat substrate, silicon nitride substrate, glass substrate, ITO substrate or the like) that are conventionally used in the manufacture of semiconductor device. However, the composition can be used for substrates having holes with an aspect ratio less than 1, or substrates having steps in order to flatten the surface thereof. Further, the composition can be used for substrates having no steps. In the meantime, these substrates may be substrates on which an inorganic anti-reflective coating is formed by CVD method or the like, and the gap fill material forming composition of the present invention can be coated on the substrate.

The gap fill material formed from the gap fill material forming composition of the present invention may contain an absorption for light used in the lithography process. In such a case, the gap fill material can act as a layer having a prevent effect against light reflected from the substrate. Further, the gap fill material of the present invention can be used as a layer for preventing an interaction between the substrate and the photoresist, as a layer having a function that prevents an adverse effect against the substrate by the material used for the photoresist or by substances formed on exposure to light of the photoresist, or as a layer having a function that prevents diffusion and adverse effects of substances formed in the substrate on baking under heating to the upper layer photoresist.

Hereinafter, the present invention will be described based on examples but the present invention is not limited thereto.

SYNTHETIC EXAMPLE 1

In 120 g of ethyl lactate, 30 g of 2-hydroxyethylacrylate was dissolved, and nitrogen was flowed to the reaction solution for 30 minutes, then the temperature was raised to 70° C. While the reaction solution was kept at 70° C., 0.3 g of azobisisobutyronitrile was added, and stirred under nitrogen atmosphere at 70° C. for 24 hours to obtain a solution of poly(2-hydroxyethyl)acrylate.

The resulting polymer was subjected to GPC analysis by use of GPC apparatus (RI8020, SD8020, C08020, AS8020, DP8020) manufactured by Tosoh Corporation. The analysis was carried out by flowing 10 μl of a DMF solution containing 0.05 mass % of the resulting polymer at a flow rate of 0.6 ml/min for 30 minutes in the above-mentioned apparatus and then measuring the retention time of the sample by use of detection of RI. In addition, Shodex Asahipak GF1G7B was used as a guard column, Shodex Asahipak GF710HQ, GF510HQ and GF310HQ were used as a column, and column temperature was set to 40° C.

As a result of it, the resulting polymer had a weight average molecular weight of 9800 (in terms of standard polystyrene), and the proportion of polymers having a molecular weight of 3000 or less in the polymer was 8% as calculated from area ratio of GPC curve.

SYNTHETIC EXAMPLE 2

In 111.6 g of ethyl lactate, 15 g of 2-hydroxyethylacrylate and 12.9 g of ethylacrylate were dissolved, and nitrogen was flowed to the reaction solution for 30 minutes, then the temperature was raised to 70° C. While the reaction solution was kept at 70° C., 0.3 g of azobisisobutyronitrile was added, and stirred under nitrogen atmosphere at 70° C. for 24 hours to obtain a copolymer solution of 2-hydroxyethyl-acrylate with ethylacrylate.

GPC analysis was carried out similarly to the above. The resulting polymer had a weight average molecular weight of 11000 (in terms of standard polystyrene), and the proportion of polymers having a molecular weight of 3000 or less in the polymer was 9% as calculated from area ratio of GPC curve.

SYNTHETIC EXAMPLE 3

In 80.0 g of propylene glycol methyl ether, 15 g of 2-hydroxypropylacrylate and 5.0 g of benzylacrylate were dissolved, and nitrogen was flowed to the reaction solution for 30 minutes, then the temperature was raised to 70° C. While the reaction solution was kept at 70° C., 0.4 g of azobisisobutyronitrile was added, and stirred under nitrogen atmosphere at 70° C. for 24 hours to obtain a copolymer solution of 2-hydroxypropylacrylate with benzylacrylate.

GPC analysis was carried out similarly to the above. The resulting polymer had a weight average molecular weight of 15000 (in terms of standard polystyrene), and the proportion of polymers having a molecular weight of 3000 or less in the polymer was 8% as calculated from area ratio of GPC curve.

EXAMPLE 1

To 20 g of a solution containing poly(2-hydroxyethyl)acrylate obtained in Synthesis Example 1, 0.92 g of tetramethoxymethyl glycoluril, 0.0046 g of pyridinium-p-toluene sulfonic acid, 9.50 g of propylene glycol monomethyl ether and 6.18 g of ethyl lactate were added to obtain 13.5% solution. Then, the resulting solution was filtered through a micro filter made of polyethylene having a pore diameter of 0.05 μm, to prepare a gap fill material forming composition solution for lithography.

EXAMPLE 2

To 20 g of a solution containing poly(2-hydroxyethyl)acrylate obtained in Synthesis Example 1, 0.92 g of tetramethoxymethyl glycoluril, 0.0046 g of pyridinium-p-toluene sulfonic acid, 11.2 g of propylene glycol monobutyl ether and 0.800 g of ethyl lactate were added to obtain 15.0% solution. Then, the resulting solution was filtered through a micro filter made of polyethylene having a pore diameter of 0.05 μm, to prepare a gap fill material forming composition solution for lithography.

EXAMPLE 3

To 20 g of a solution containing the copolymer of 2-hydroxyethylacrylate with ethylacrylate that was obtained in Synthesis Example 2, 0.92 g of tetramethoxymethyl glycoluril, 0.0046 g of pyridinium-p-toluene sulfonic acid, 9.50 g of propylene glycol monomethyl ether and 6.18 g of ethyl lactate were added to obtain 13.5% solution. Then, the resulting solution was filtered through a micro filter made of polyethylene having a pore diameter of 0.05 μm, to prepare a gap fill material forming composition solution for lithography.

EXAMPLE 4

To 20 g of a solution containing the copolymer of 2-hydroxypropylacrylate with benzylacrylate that was obtained in Synthesis Example 3, 0.92 g of hexamethoxymethyl melamine, 0.009 g of pyridinium-p-toluene sulfonic acid, 10.66 g of propylene glycol monomethyl ether and 11.43 g of propylene glycol monomethyl ether acetate were added to obtain 11.5% solution. Then, the resulting solution was filtered through a micro filter made of polyethylene having a pore diameter of 0.05 μm, to prepare a gap fill material forming composition solution for lithography.

EXAMPLE 5

To 20 g of a solution containing the copolymer of 2-hydroxypropylacrylate with benzylacrylate that was obtained in Synthesis Example 3, 0.92 g of tetramethoxymethyl glycoluril, 0.007 g of pyridinium-p-toluene sulfonic acid, 10.66 g of propylene glycol monomethyl ether and 11.43 g of propylene glycol monomethyl ether acetate were added to obtain 11.5% solution. Then, the resulting solution was filtered through a micro filter made of polyethylene having a pore diameter of 0.05 μm, to prepare a gap fill material forming composition solution for lithography.

COMPARATIVE EXAMPLE 1

To 4 g of commercially available polyethylene glycol (Junsei Chemical Co., Ltd., trade name: Polyethylene glycol 2000), 0.92 g of tetramethoxymethyl glycoluril, 0.0046 g of pyridinium-p-toluene sulfonic acid, 11.0 g of propylene glycol monomethyl ether and 25.6 g of ethyl lactate were added to obtain 13.5% solution. Then, the resulting solution was filtered through a micro filter made of polyethylene having a pore diameter of 0.05 μm, to prepare a gap fill material forming composition solution for lithography.

Dissolution Test in Solvent for Photoresist

The solutions of the gap fill material forming compositions obtained in Examples 1 and 2 and Comparative Example 1 were coated on silicon wafers by means of a spinner. The coated silicon wafers were baked at 205° C. for 1 minute on a hot plate to form gap fill materials for lithography (film thickness 0.22 μm). The gap fill materials were dipped in a solvent used for photoresists, for example ethyl lactate and propylene glycol monomethyl ether and as a result it was confirmed that the resulting gap fill materials were insoluble in these solvents.

Test of Intermixing with Photoresist

The solutions of the gap fill material forming compositions obtained in Examples 1 to 5 and Comparative Example 1 were coated on silicon wafers by means of a spinner. The coated silicon wafers were baked at 205° C. for 1 minute on a hot plate to form gap fill materials, and the film thickness thereof was measured (film thickness 0.22 μm). On each gap fill material was coated a commercially available photoresist solution (manufactured by Shipley Company; trade name: APEX-E, etc.) by means of a spinner. The coated wafers were heated at 90° C. for 1 minute on a hot plate. After exposure of the photoresists to light, post exposure bake was performed at 90° C. for 1.5 minute. After developing the photoresists, the film thickness of the gap fill materials for lithography was measured and it was confirmed that no intermixing occurred between the gap fill materials for lithography obtained from anti-reflective coating solutions prepared in Examples 1 to 5 and Comparative Example 1 and the photoresist layers.

Tests on Flattening Rate and Fill Property

The solutions of the gap fill material forming compositions obtained in Examples 1 to 5 and Comparative Example 1 were coated on $SiO_2$ wafer substrates having holes (diameter: 0.18 μm, depth: 1.0 μm) by means of a spinner. The coated silicon wafer substrates were baked at 205° C. for 1 minute on a hot plate to form gap fill materials, and the film thickness thereof was 0.50 μm at the open area where hole pattern is not present in the vicinity. The flattening rate of the resulting gap fill material for lithography was assessed by observing with a scanning electron microscope (SEM) the sectional form of the $SiO_2$ wafer substrate having holes on which the gap fill material obtained in Examples 1 to 5 and Comparative Example 1 was applied. The results are shown in Table 1. The flattening rate was determined according to the following equation. The flattening rate was 100% when holes on the substrate were perfectly flattened.

Flattening Rate=[1−(dimple depth a of gap fill material for lithography at the center of holes)/(hole depth b)]×100

In addition, no void (gap) was observed inside the holes, and it was observed that the inside of the holes was filled with the gap fill material.

The substrate used is $SiO_2$ wafer substrate having Iso (isolated) and Dense (dense) patterns of holes shown in FIG. 1. Iso pattern is a pattern in which a distance from the hole center to the center of the adjacent hole is 5 times the diameter of the hole. In addition, Dense pattern is a pattern in which a distance from the hole center to the center of the adjacent hole is 1 time the diameter of the hole. The depth of holes is 1.0 μm, and the diameter of holes is 0.18 μm.

TABLE 1

|  | Film Thickness (nm) | | | Flattening Rate (%) | | |
| --- | --- | --- | --- | --- | --- | --- |
|  | Iso | Dense | Bias | Iso | Dense | Bias |
| Example 1 | 490 | 300 | 190 | 100 | 100 | 0 |
| Example 2 | 480 | 400 | 80 | 100 | 100 | 0 |
| Example 3 | 500 | 330 | 170 | 100 | 100 | 0 |
| Example 4 | 450 | 300 | 150 | 100 | 100 | 0 |
| Example 5 | 470 | 350 | 120 | 100 | 100 | 0 |
| Comparative Example 1 | 480 | 200 | 280 | 100 | 95 | 5 |

Difference (Bias) in film thickness on Iso (isolated) and Dense (dense) patterns in the gap fill material for lithography of Examples 1 to 5 is smaller than that of Comparative Example 1. Examples 1 to 5 are particularly excellent in fluidity on fine Dense hole pattern on which it is difficult to obtain constant film thickness.

It is assumed that the gap fill material forming composition solution smoothly flows into a plurality of holes even at Dense part having larger hole number (hole density) per unit area on the hole substrate, thereby providing constant film thickness, and that consequently difference in film thickness of Iso part and Dense part becomes small and flattening rate becomes high.

Further, the gap fill materials for lithography of Examples 1 to 5 show flattening property irrespective of Iso part and Dense part, on the contrary Comparative Example 1 is not good in flattening property at Dense pattern.

The present invention is a composition for forming gap fill material for lithography, an object of which is to accomplish a high flattening property of substrate and a high fill property into the inside of holes. In addition, the resulting gap fill material for lithography has not only flattening property of substrate and a high fill property into the inside of holes but also a high etching rate.

As the present invention makes possible to fill unevenness of a substrate having holes and flatten it, it makes possible to improve evenness of film thickness of photoresist or the like formed thereon. Therefore, according to the present invention, a good pattern shape of photoresist can be formed even in the process by use of substrates having holes.

Further, the present invention can provide an excellent gap fill material for lithography that has a high dry etching rate compared with photoresists, cause no intermixing with photoresists, and induces no diffusion into photoresists upon heat-drying, and also can provide an excellent method for forming resist pattern.

The invention claimed is:

1. A gap fill material forming composition comprising:
    a crosslinking agent having at least two crosslink-forming functional substituents;
    a solvent selected from the group consisting of butyl lactate, propylene glycol monobutyl ether, propylene glycol monomethyl ether, propylene glycol monomethyl ether acetate, and cyclohexanone; and
    a polymer having a weight average molecular weight of 5,000 to 20,000 and containing components having a molecular weight of 3,000 or less in a rate of 20% or less, the polymer consisting of a structural unit of formula (1)

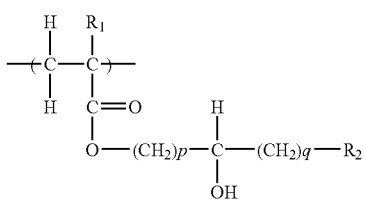

(1)

where $R_1$ is a hydrogen atom, a methyl group, a chlorine atom or a bromine atom;
    $R_2$ is a hydrogen atom or a hydroxy group;
    p is a number of 1, 2, 3 or 4;
    q is a number of 0, 1, 2 or 3;

wherein the composition is used in manufacture of a semiconductor device by a method comprising coating a photoresist on a semiconductor substrate having a hole with aspect ratio shown in height/diameter of 1 or more, and transferring an image to the semiconductor substrate by use of a lithography process.

2. The gap fill material forming composition according to claim 1, further containing an acid or an acid generator.

3. A method for forming a gap fill material for use in lithography process of manufacture of a semiconductor device, comprising
    coating the gap fill material forming composition according to claim 1 on the semiconductor substrate having a hole with aspect ratio shown in height/diameter of 1 or more and
    baking the semiconductor substrate.

4. A method for forming photoresist pattern for use in manufacture of a semiconductor device, comprising:
    coating the gap fill material forming composition according to claim 1 on the semiconductor substrate,
    baking the semiconductor substrate to form a gap fill material,
    forming a photoresist layer on the gap fill material,
    exposing the semiconductor substrate covered with the gap fill material and the photoresist layer to light, and
    developing the photoresist layer after the exposure to the light.

5. The method for forming photoresist pattern according to claim 4, further comprising a step of forming an anti-reflective coating before or after the step of coating the gap fill material on the semiconductor substrate.

6. A gap fill material forming composition comprising:
    a crosslinking agent having at least two crosslink-forming functional substituents;
    a solvent selected from the group consisting of butyl lactate, propylene glycol monobutyl ether, propylene glycol monomethyl ether, propylene glycol monomethyl ether acetate, and cyclohexanone; and
    a polymer having a weight average molecular weight of 5,000 to 20,000 and containing components having a molecular weight of 3,000 or less in a rate of 20% or less, the polymer consisting of a structural unit of formula (1) and a structural unit of formula (2)

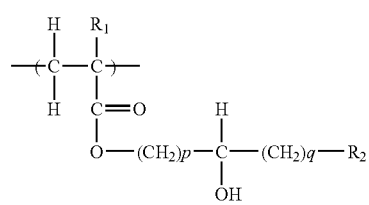

(1)

where $R_1$ is a hydrogen atom, a methyl group, a chlorine atom or a bromine atom;
    $R_2$ is a hydrogen atom or an hydroxy group;
    p is a number of 1, 2, 3 or 4; and
    q is a number of 0, 1, 2 or 3;

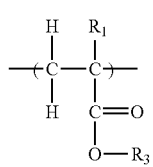
(2)

where $R_1$ is as defined above; and
$R_3$ is a $C_{1-8}$ alkyl group, a benzyl group, a $C_{1-6}$ alkyl group substituted by at least one fluorine atom, a chlorine atom, a bromine atom, or a $C_{1-6}$ alkyl group substituted by at least one $C_{1-6}$ alkoxy group, wherein:
the polymer contains the structural unit of formula (1) in a molar ratio of 0.10 to 0.95;
the composition is used in manufacture of a semiconductor device by a method comprising coating a photoresist on a semiconductor substrate having a hole with aspect ratio shown in height/diameter of 1 or more, and transferring an image to the semiconductor substrate by use of a lithography process; and
a sum of the molar ratio of structural unit of formula (1) and the molar ratio of structural unit of formula (2) is 1.

* * * * *